(12) United States Patent
Myrto et al.

(10) Patent No.: US 9,609,781 B2
(45) Date of Patent: Mar. 28, 2017

(54) MODULAR CHASSIS WITH FLOATING MIDPLANE CARRIER

(71) Applicant: Lenovo Enterprise Solutions (Singapore) Pte. Ltd., Singapore (SG)

(72) Inventors: Glenn E. Myrto, Holly Springs, NC (US); Daniel P. Kelaher, Holly Springs, NC (US); Camillo Sassano, Durham, NC (US); John P. Scavuzzo, Cary, NC (US); Timothy M. Wiwel, Raleigh, NC (US); Paul A. Wormsbecher, Apex, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 5 days.

(21) Appl. No.: 14/618,562

(22) Filed: Feb. 10, 2015

(65) Prior Publication Data
US 2016/0234961 A1 Aug. 11, 2016

(51) Int. Cl.
*G06F 1/16* (2006.01)
*H05K 7/14* (2006.01)

(52) U.S. Cl.
CPC ................. *H05K 7/1445* (2013.01)

(58) Field of Classification Search
CPC .............................. G06F 1/183; H04K 5/1484
USPC .......... 312/334.46, 333, 330.1, 223.2, 223.1, 312/223.3; 360/97.12; 361/679.02, 361/679.58, 679.31, 679.53, 679.52, 361/679.33, 679.4, 679.32, 679.57, 361/679.38, 679.37, 679.51; 370/281, 370/218, 390, 412; 165/80.3, 80.4
See application file for complete search history.

(56) References Cited

U.S. PATENT DOCUMENTS

| | | | |
|---|---|---|---|
| 5,863,211 A | 1/1999 | Sobotta et al. | |
| 6,450,698 B1 | 9/2002 | Chen et al. | |
| 6,582,133 B2 | 6/2003 | Harris et al. | |
| 6,592,268 B2 | 7/2003 | Chen et al. | |
| 8,358,511 B2 | 1/2013 | Huels et al. | |
| 8,641,292 B2 | 2/2014 | Roitberg et al. | |
| 2005/0068754 A1 | 3/2005 | Corrado et al. | |
| 2010/0165894 A1* | 7/2010 | Furuskar | H04L 5/1484 370/281 |
| 2011/0182030 A1* | 7/2011 | Mayer | G06F 1/183 361/679.58 |
| 2012/0170191 A1* | 7/2012 | Jensen | G06F 1/185 361/679.02 |

FOREIGN PATENT DOCUMENTS

| | | |
|---|---|---|
| JP | 2012528408 | 11/2012 |
| JP | 2013171320 | 9/2013 |

* cited by examiner

*Primary Examiner* — Hung Duong
(74) *Attorney, Agent, or Firm* — Jason Friday; Andrew M. Calderon; Roberts Mlotkowski Safran, Cole & Calderon, P.C.

(57) ABSTRACT

A split chassis with a floating midplane carrier is provided. The split chassis is a modular electronic chassis which includes a first chassis section and a midplane carrier floatingly mounted to the first chassis section. The modular electronic chassis further includes a second chassis section mounted to the first chassis section, with the midplane carrier mounted between the first chassis section and the second chassis section.

18 Claims, 4 Drawing Sheets

MODULAR CHASSIS WITH FLOATING MIDPLANE CARRIER

FIELD OF THE INVENTION

The invention relates to a modular chassis and, more particularly, to a split chassis with a floating midplane carrier.

BACKGROUND

Many electronic chassis designs are modular in nature due to increases in the need for system density and quick serviceability. System designs such as blade server designs are modeled after modular networking chassis with individual network cards or other types of modular components. These modular designs have one large chassis with inner modules that slide out from the front or rear of the main chassis.

In some designs, several plug-in optoelectronic cards or other types of modules are interconnected according to a required connection scheme, using a backplane. In these designs, the backplane is provided as a connection point between the cards or other types of modules. For example, the backplane has front side blind mate optical connectors providing connection to the front side of the backplane, and rear side hand inserted optical connectors providing connection to the rear side of the backplane and extending outwardly from the rear surface. The connectors on both the front side and the rear side are designed to mate with the plug-in optoelectronic cards or other types of modules.

In using a backplane, the rear side of the backplane provides an interconnect from one card to another card through cables which have connector portions mating with rear side connectors. In order to connect several cards or other types of modules, multiple connectors of different types may be required on both sides of the backplane. Use of multiple cables results in ineffective utilization of space and makes the design of the interconnection module complicated and expensive.

SUMMARY OF THE INVENTION

In an aspect of the invention, a modular electronic chassis comprises a first chassis section and a midplane carrier floatingly mounted to the first chassis section. The modular electronic chassis further comprises a second chassis section mounted to the first chassis section, with the midplane carrier mounted between the first chassis section and the second chassis section.

In an aspect of the invention, a modular chassis comprises a front chassis with compartments structured to hold modules. The modular chassis further comprises a rear chassis with compartments structured to hold additional modules. The modular chassis comprises floating midplane positioned between the front chassis and the rear chassis, and which includes connectors connecting to the modules of the front chassis and the additional modules of the rear chassis.

In an aspect of the invention, a modular chassis comprises: a front chassis, a rear chassis and a floating midplane. The front chassis comprises: compartments structured to hold modules; alignment holes; and an outwardly extending arm. The rear chassis comprises: compartments structured to hold additional modules; a flange having pins extending outwardly therefrom; and a slot which accepts the arm of the front chassis. The floating midplane is positioned between the front chassis and the rear chassis, and comprises: connectors connecting to the modules of the front chassis and the additional modules of the rear chassis; pins engaging with the holes of the front chassis structured to self-align at least the modules with the connectors of the floating midplane; and flanges with slots that accept the outwardly extending pins of the rear chassis such that the floating midplane floats in a vertical orientation and horizontal orientation with respect to the rear chassis.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention relates to a modular chassis and, more particularly, to a split electronic chassis with a floating midplane carrier. In embodiments, the floating midplane carrier facilitates connection of modular components assembled within a front chassis section and rear chassis section of the modular chassis. More specifically and advantageously, the floating midplane carrier to which all modular components connect, and the modular components themselves, all float (i.e., move in multiple directions, albeit restricted in displacement as described herein) within a portion of the modular chassis to allow all modular components to self-align and dock correctly into their connectors on the floating midplane carrier.

By way of more specific example, the modular chassis comprises a split chassis having a front chassis section and a rear chassis section (e.g., shuttle), each of which hold a variety of different modular components. By way of example, the modular components can be subsystems of a computing system such as storage modules, I/O modules, fan modules, power modules, and CPU, etc. The modular components are connected to a floating midplane carrier, which is toollessly attached to the rear chassis section and is allowed to float vertically and horizontally. This float allows locating pins on the floating midplane carrier to correctly locate the different modules to perfectly align with the various modules as they are installed into the overall chassis, e.g., within the front chassis section and the rear chassis section.

Figure 1:
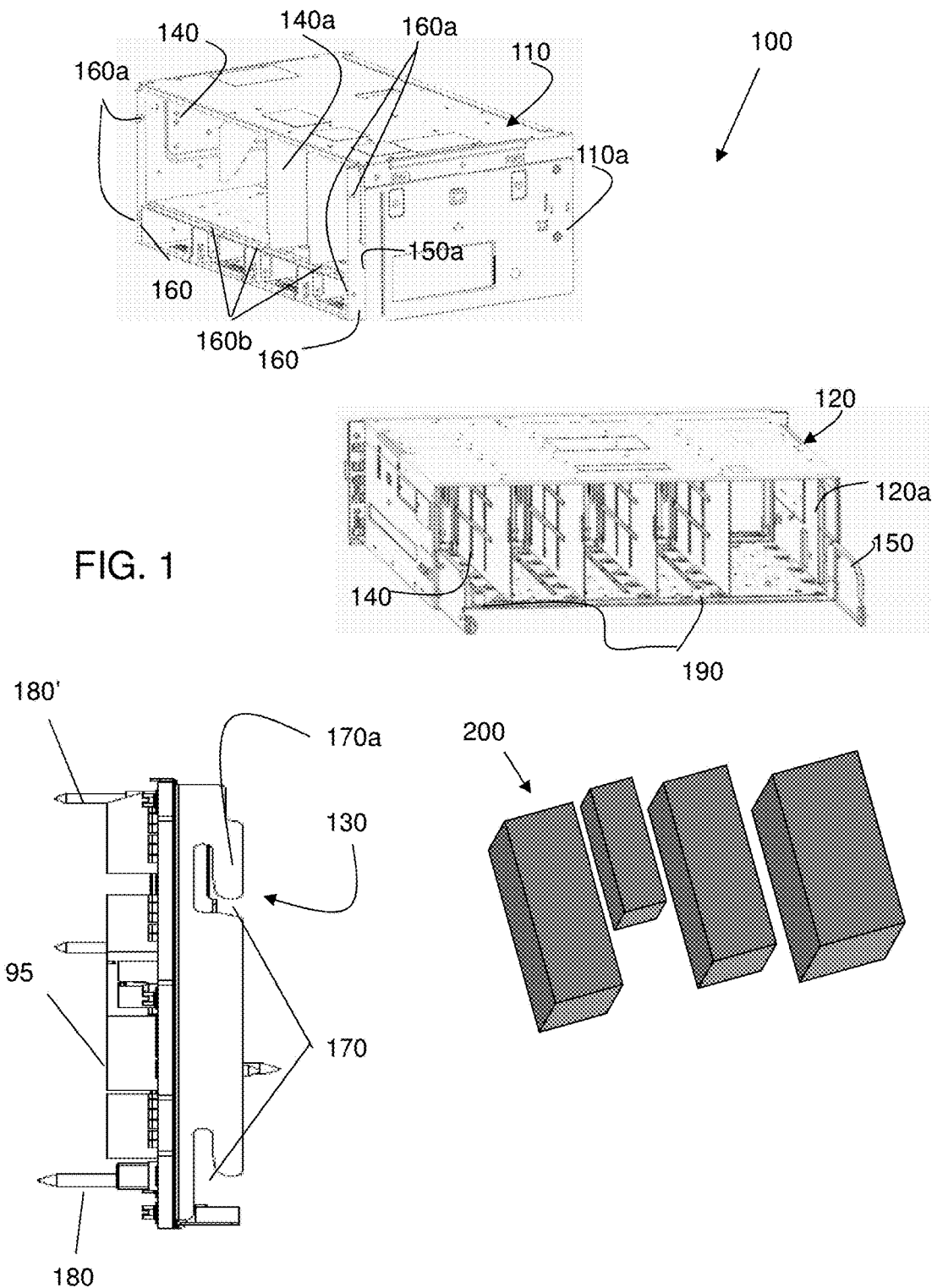
FIG. 1 shows an exploded perspective view of a modular chassis in accordance with aspects of the invention.

More specifically, FIG. 1 shows an exploded perspective view of a split or modular chassis in accordance with aspects of the invention. The modular chassis 100 includes a first chassis section 110 (e.g., rear chassis section), a second chassis section 120 (e.g., front chassis section) and a midplane carrier 130 which, during assembly, will float between the rear chassis section 110 and the front chassis section 120 as described herein. The rear chassis section 110 and the front chassis section 120 include a plurality of compartments 140 which, in embodiments, can be of different configurations (e.g., sizes and shapes) corresponding to a size and shape of respective modular components (subsystems) 200 which are mounted therein. The compartments 140 can be composed of fins or walls 140a, which provide additional strength to the modular chassis 100 and, more specifically, will minimize any deflection of components of the rear chassis section 110 and the front chassis section 120.

The front chassis section 120 further includes one or more support and connecting arm(s) 150 which correspond to one or more slots 150a provided on a sidewall 110a of the rear chassis section 110. In embodiments, the support and connecting arm(s) 150 extend outwardly from a respective sidewall 120a of the front chassis section 120, and will engage within the corresponding slot(s) 150a of the rear chassis section 110 in the assembled state. The support and connecting arm(s) 150 will extend on the side of the midplane carrier 150, in the assembled state. By using the support and alignment arm(s) 150, the rear chassis section 110, the midplane carrier 130 and the front chassis section 120 will remain aligned and connected together in the assembly state.

The rear chassis section 110 further comprises a flange 160, with one or more pins 160a extending therefrom. The pins 160a correspond to slots 170 formed on flanges 170a positioned at vertical edges of the midplane carrier 130. In embodiments, the flanges 170a of the midplane carrier 130 are spaced apart slightly wider than the corresponding mounting surfaces, e.g., flanges 160 of the rear chassis section 110, to allow left to right float of the midplane carrier 130. Moreover, in embodiments, the slots 170 of the midplane carrier 130 are vertically oriented slots which accept the pins 160a of the rear chassis section 110 and, in embodiments, allow the midplane carrier 130 to float vertically with respect to the rear chassis section 110.

In the assembled state, the midplane carrier 130 will also align and engage with a plurality of alignment pins 160b on a ledge of the rear chassis section 110. The alignment pins 160b and respective ledge will support the midplane carrier 130 in the assembled state.

Referring still to FIG. 1, the vertical float (i.e., movement in multiple directions, albeit restricted in displacement) of the midplane carrier 130 facilitates locating pins 180 and 180' on the midplane carrier 130 to correctly locate the different modules 200. More specifically, a plurality of locating pins 180 and 180' on the midplane carrier 130 extend about a perimeter or portion thereof of the midplane carrier 130; although other locations are also contemplated herein. The plurality of locating pins 180' correspond to a plurality of holes provided within the modules 200. In embodiments, the plurality of locating pins 180 will locate and engage with the plurality of holes 190 within the front chassis section 120, during the assembly of the modular chassis 100.

As the midplane carrier 130 can vertically float (i.e., move in multiple directions, albeit restricted in displacement) relative to the rear chassis section 110 (due to the engagement of the pins 160a and corresponding slots 170), the locating pins 180 can engage the corresponding plurality of holes 190 to align the modules 200 with respective connectors 195 of the midplane carrier 130. Accordingly, as the midplane carrier 130 is not fixedly attached to the rear chassis section 110, the modular components 200 assembled within the front chassis section 120 can easily self-align and dock correctly (e.g., connect to) the plurality of connectors 195 provided on the midplane carrier 130. Also, as the modules 200 in both the front chassis section 120 and the rear chassis section 110 are connected to the connectors 195 of the midplane carrier 130, they will float within the compartments 140 of the chassis.

Figure 2:
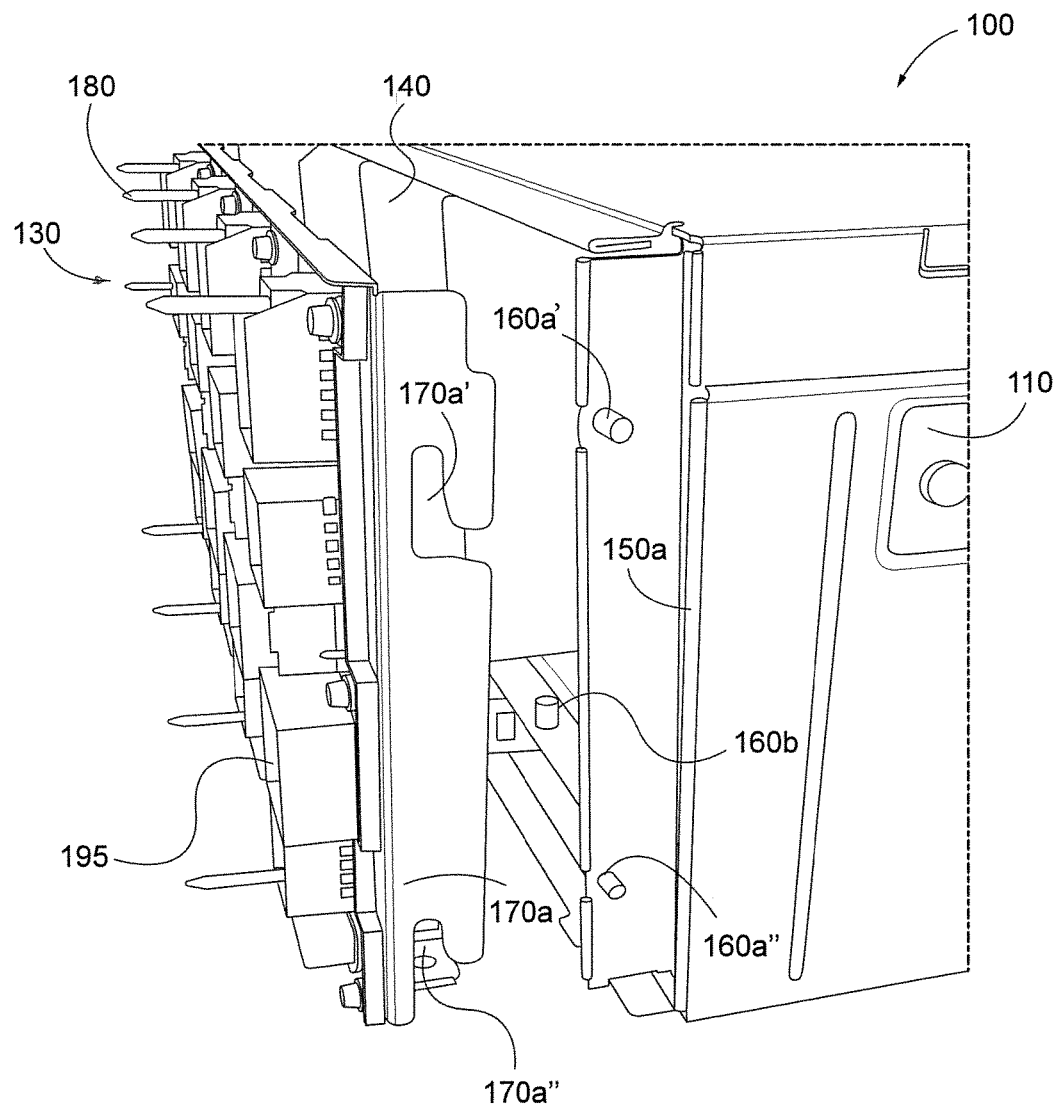
FIG. 2 shows a perspective view of a midplane carrier partially mounted to a rear chassis component of the modular chassis in accordance with aspects of the invention.

FIG. 2 shows a perspective view of the midplane carrier 130 partially mounted to the rear chassis section 110 of the modular chassis 100 in accordance with aspects of the invention. As shown in FIG. 2, the midplane carrier 130 includes two slots: an "L" shaped slot 170a' and a vertical slot 170a". In embodiments, the L" shaped slot 170a' can be an upper slot, whereas, vertical slot 170a" can be a lower slot; although other configurations are also contemplated by the present invention.

In an assembly process shown representatively in FIG. 2, the horizontal portion of the "L" shaped slot 170a' will first accept the upper pin 160a' of the rear chassis section 110. Once the upper pin 160a' is engaged in the horizontal portion of the "L" shaped slot 170a', the lower portion of the floating midplane carrier 130 will then be pivoted or moved toward the rear chassis section 110 until the lower pin 160a" is aligned with the vertical slot 170a". In this position, the upper pin 160a' will also be aligned with the vertical portion of the "L" shaped slot 170a'. As should be understood, as a section of the flange 170a is removed at the lower portion of the vertical slot 170a", the lower pin 160a" can be aligned with the vertical lower slot 170a" without any interference. The midplane carrier 130 is then moved downward such that the upper pin 160a' and the lower pin 160a" will be fully accepted within the vertical portion of the "L" shaped slot 170a' and the vertical slot 170a", respectively. By using the slot and pin assembly, the midplane carrier 130 can now float vertically along the length of the slots 170a, 170b.

Figure 3:
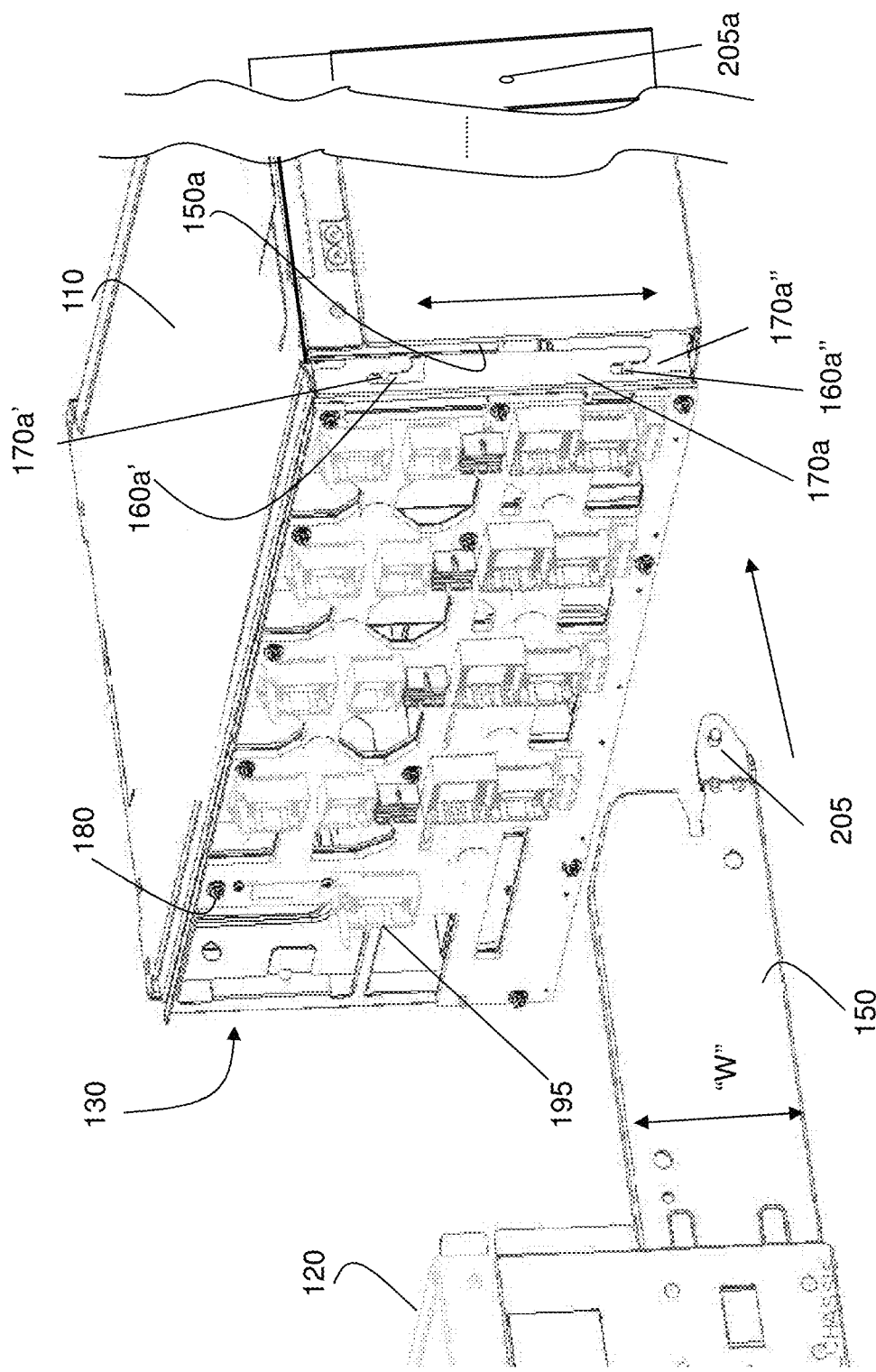
FIG. 3 shows a perspective view of the midplane carrier mounted to the rear chassis component of the modular chassis in accordance with aspects of the invention.

FIG. 3 shows a perspective view of the midplane carrier 130 mounted to the rear chassis section 110 of the modular chassis 100 in accordance with aspects of the invention. As shown in FIG. 3, the upper pin 160a' and the lower pin 160a" of the rear chassis section 110 are engaged within the "L" shaped slot 170a' and the vertical slot 170a" of the midplane carrier 130, respectively. As shown representatively by the arrow in FIG. 3, the midplane carrier 130 can slide in the vertical direction (e.g., up and down) by the upper pin 160a' and the lower pin 160a" of the rear chassis section 110 engaging with the vertical portions of the "L" shaped slot 170a' and the vertical slot 170a". Also, the midplane carrier 130 will be limited in its extent of vertical float to only the length of the vertical section of the L" shaped slot 170a' due to the horizontal portion of the "L" shaped slot 170a'.

As further shown in FIG. 3, the one or more support and connecting arm(s) 150 of the front chassis section 120 is aligned with corresponding one or more slots 150a provided on the rear chassis section 110. The front chassis section 120 will then be moved toward the rear chassis section 110 until the one or more support and connecting arm(s) 150 fully engage the one or more slots 150a. In one aspect of the invention, the one or more support and connecting arm(s) 150 can include a locking mechanism 205 that engages with a corresponding locking mechanism of the rear chassis section 110. In one embodiment, the locking mechanism 205 can be a spring loaded button that engages within a corresponding opening 205a' in a sidewall of the rear chassis section 110.

As the one or more slots 150a have an opening that is larger than the width "W" of the one or more support and alignment arms 150, it is possible to align and then insert the locating pins 180 into corresponding plurality of holes of the front chassis section 120. In this way, it is now possible to easily self-align and dock correctly (e.g., connect to) the plurality of connectors 195 on the midplane carrier 130 to the components housed within the front chassis section 120.

Figure 4:
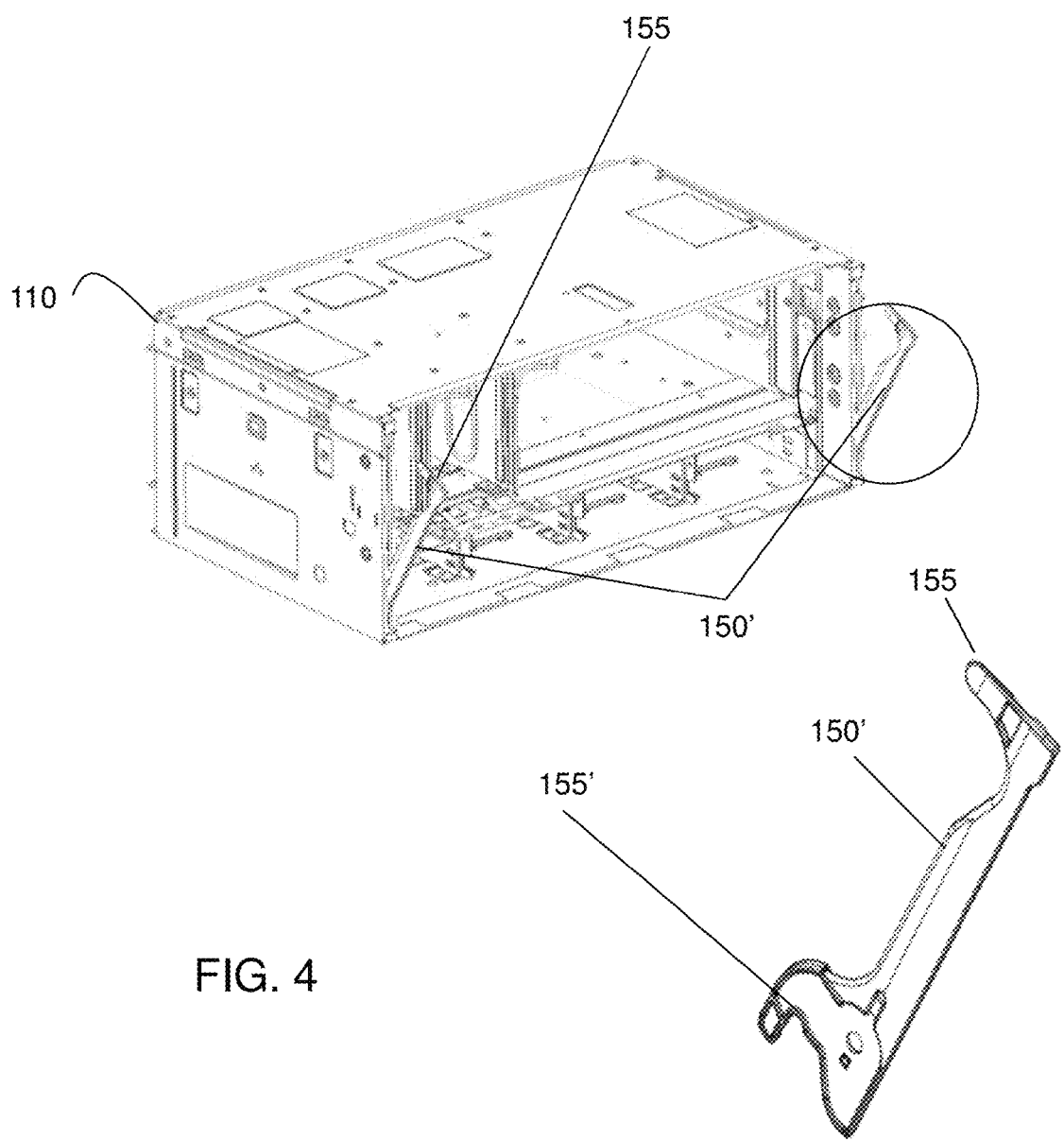
FIG. 4 shows a perspective view of the front chassis section in accordance with additional aspects of the invention.

FIG. 4 shows another embodiment of the rear chassis section 110. In this embodiment, the support and connecting arm(s) 150' are cam handles for locking of the front chassis section 120 to the rear chassis section 110. In embodiments, the cam handles 150' include a grip portion 155 and a latching hooked or cam portion 155' which has a gradual sloped or cam surface for engaging the locking mechanism, e.g., locking pin, on the front chassis section 120. The cam handles 150' can also be spring loaded.

In operation and much like that which was described with reference to FIG. 3, the cam handles 150' are aligned with corresponding one or more slots 150a provided on the rear chassis section 110. The front chassis section 120 will then be moved toward the rear chassis section 110 until the cam handles 150' are aligned with a locking pin of the front chassis section 120. In one embodiment, the cam handles 150' can be a spring loaded such that they automatically engage within a locking pin of the front chassis section 120 in a sidewall of the rear chassis section 110. As the cam handles 150' are engage within a locking pin of the front chassis section 120, they will move the front chassis section 120 toward the rear chassis section 110 (or vice versa or both), in order to ensure a tight fit between the components. In this way, it is now possible to easily self-align and dock correctly (e.g., connect to) the plurality of connectors 195 on the midplane carrier 130 to the components housed within the front chassis section 120.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A modular electronic chassis, comprising:
a first chassis section;
a midplane carrier floatingly mounted to the first chassis section; and
a second chassis section mounted to the first chassis section, with the midplane carrier mounted between the first chassis section and the second chassis section, wherein the second chassis section includes one or more arms which are accepted within one or more slots provided on the first chassis section.

2. The modular electronic chassis of claim 1, wherein the midplane carrier vertically floats with respect to the first chassis section.

3. The modular electronic chassis of claim 1, wherein the first chassis section and the second chassis section have compartments which house modular components, which connect directly to connectors on the midplane carrier.

4. The modular electronic chassis of claim 3, wherein the one or more locking mechanism of the one or more arms are cam handles which engages with a corresponding pin mechanism.

5. The modular electronic chassis of claim 1, wherein the one or more arms include a locking mechanism that engages with a corresponding locking mechanism of the first chassis section.

6. The modular electronic chassis of claim 1, wherein:
the midplane carrier comprises at least one vertically oriented slot at an edge; and
the first chassis section further comprises at least one pin which is accepted within the at least one vertically oriented slot.

7. The modular electronic chassis of claim 6, wherein the at least one vertically oriented slot is at least two vertically oriented slots provided in flanges of the midplane carrier, and the flanges are spaced apart wider than corresponding mounting surfaces of the first chassis section to allow left to right float of the midplane carrier.

8. The modular electronic chassis of claim 7, wherein the at least one vertically oriented slot is an upper "L" shaped slot and a vertical lower slot and the at least one pin is an upper pin and a lower pin which are accepted by the upper "L" shaped slot and the vertical lower slot, respectively.

9. The modular electronic chassis of claim 6, wherein the midplane carrier includes locating pins which engage a plurality of holes provided within the second chassis section to locate, vertically, different modules housed within the second chassis section.

10. The modular electronic chassis of claim 6, wherein the midplane carrier is not fixedly attached to the first chassis section.

11. A modular chassis, comprising:
a front chassis with compartments structured to hold modules;
a rear chassis with compartments structured to hold additional modules; and
a floating midplane positioned between the front chassis and the rear chassis, and which includes connectors connecting to the modules of the front chassis and the additional modules of the rear chassis,
wherein the floating midplane includes flanges with slots that accept pins located on the rear chassis on each end.

12. The modular chassis of claim 11, wherein the modules and additional modules float vertically within a center of the modular chassis to allow the modules to self align and dock to the connectors on the midplane.

13. The modular chassis of claim 11, wherein:
the slots comprise vertically oriented slots; and
wherein the pins are configured to be accepted within the vertically oriented slots.

14. The modular chassis of claim 13, wherein a first of the vertically oriented slots is an upper "L" shaped slot and a second of the vertically oriented slots is a vertical lower slot.

15. The modular chassis of claim 14, wherein the floating midplane includes locating pins which engage a plurality of holes provided within the front chassis to locate, vertically, different modules housed within the front chassis.

16. The modular chassis of claim 11, wherein the flanges are spaced wider than mounting surfaces of the rear chassis to allow a horizontal float of the floating midplane.

17. A modular chassis, comprising:
a front chassis with compartments structured to hold modules;
a rear chassis with compartments structured to hold additional modules; and
a floating midplane positioned between the front chassis and the rear chassis, and which includes connectors connecting to the modules of the front chassis and the additional modules of the rear chassis, wherein:
the front chassis includes one or more arms extending one or more slots provided in the rear chassis; and the one or more arms include a locking mechanism that engages with a corresponding locking mechanism of the rear chassis.

18. A modular chassis, comprising:
a front chassis comprising:
  compartments structured to hold modules;
  alignment holes; and
  an outwardly extending arm;
a rear chassis, comprising:
  compartments structured to hold additional modules;
  a flange having pins extending outwardly therefrom; and
a slot which accepts the arm of the front chassis;
a floating midplane positioned between the front chassis and the rear chassis, and which comprises:
  connectors connecting to the modules of the front chassis and the additional modules of the rear chassis;
  pins engaging with the holes of the front chassis structured to self-align at least the modules with the connectors of the floating midplane; and
  flanges with slots that accept the outwardly extending pins of the rear chassis such that the floating midplane floats in a vertical orientation and horizontal orientation with respect to the rear chassis.

* * * * *